US009626041B2

United States Patent
Goh et al.

(10) Patent No.: US 9,626,041 B2
(45) Date of Patent: Apr. 18, 2017

(54) OPTICAL TOUCH PANEL INCLUDING VERTICALLY-ARRANGED LIGHT EMITTING ELEMENT AND LIGHT RECEIVING ELEMENT

(71) Applicant: Stanley Electric Co., Ltd., Tokyo (JP)

(72) Inventors: Lingwei Goh, Tokyo (JP); Masatsuna Sawada, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 43 days.

(21) Appl. No.: 13/892,138

(22) Filed: May 10, 2013

(65) Prior Publication Data

US 2013/0300714 A1 Nov. 14, 2013

(30) Foreign Application Priority Data

May 11, 2012 (JP) ................................. 2012-109349

(51) Int. Cl.
*G06F 3/042* (2006.01)
(52) U.S. Cl.
CPC ................................. *G06F 3/0421* (2013.01)
(58) Field of Classification Search
CPC .................................................. G06F 3/0421
USPC ....................................................... 345/175
See application file for complete search history.

(56) References Cited

U.S. PATENT DOCUMENTS

| 6,972,753 B1* | 12/2005 | Kimura et al. ............... 345/175 |
| 2006/0016970 A1* | 1/2006 | Nagasaka et al. ....... 250/231.13 |
| 2010/0053119 A1* | 3/2010 | Hayasaka ............. G06F 3/0412 345/175 |
| 2010/0066704 A1* | 3/2010 | Kasai ........................... 345/175 |
| 2011/0242056 A1* | 10/2011 | Lee et al. ..................... 345/175 |
| 2012/0056853 A1 | 3/2012 | Iwamoto |
| 2012/0200537 A1 | 8/2012 | Okano |

FOREIGN PATENT DOCUMENTS

| EP | 2 088 499 A1 | 8/2009 |
| JP | 61-138040 U | 8/1986 |
| JP | 63-16329 U | 2/1988 |
| JP | 1-64738 U | 4/1989 |
| JP | 2-81118 A | 3/1990 |

(Continued)

OTHER PUBLICATIONS

Japanese Office Action for the related Japanese Patent Application No. 2012-109349 dated Mar. 8, 2016.

*Primary Examiner* — Michael Faragalla
*Assistant Examiner* — Chayce Bibbee
(74) *Attorney, Agent, or Firm* — Kenealy Vaidya LLP

(57) ABSTRACT

In an optical touch panel including a first group of light emitting and receiving packages and a second group of light emitting and receiving packages provided on a display surface at opposite sides to each other, each of the light emitting and receiving packages is formed by one light emitting element and one light receiving element vertically arranged above the display surface. The light emitting element of each light emitting and receiving package of the first group opposes the light receiving element of one light emitting and receiving package of the second group, and the light emitting element of each light emitting and receiving package of the second group opposes the light receiving element of one light emitting and receiving package of the first group.

6 Claims, 10 Drawing Sheets

(56) References Cited

FOREIGN PATENT DOCUMENTS

| | | |
|---|---|---|
| JP | 2000-172444 A | 6/2000 |
| JP | 2006-38572 A | 2/2006 |
| JP | 2009-199259 A | 9/2009 |
| JP | 2009-252012 A | 10/2009 |
| JP | 2010-55508 A | 3/2010 |

* cited by examiner

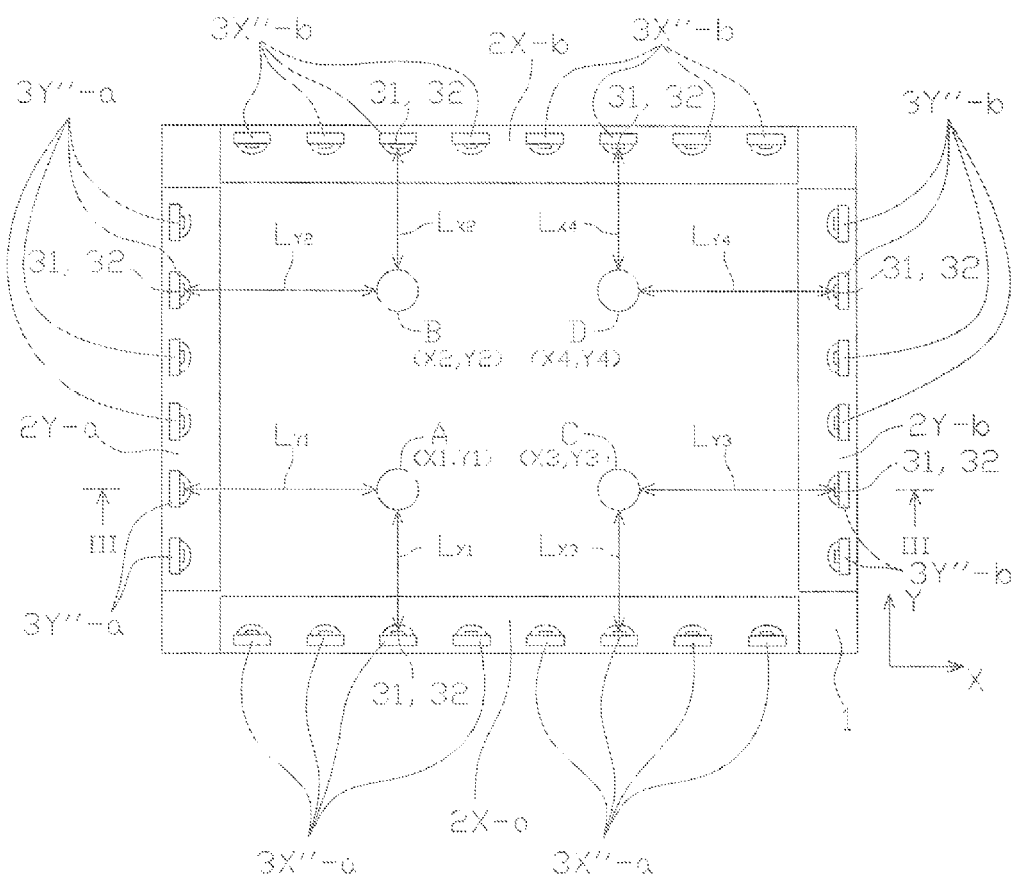

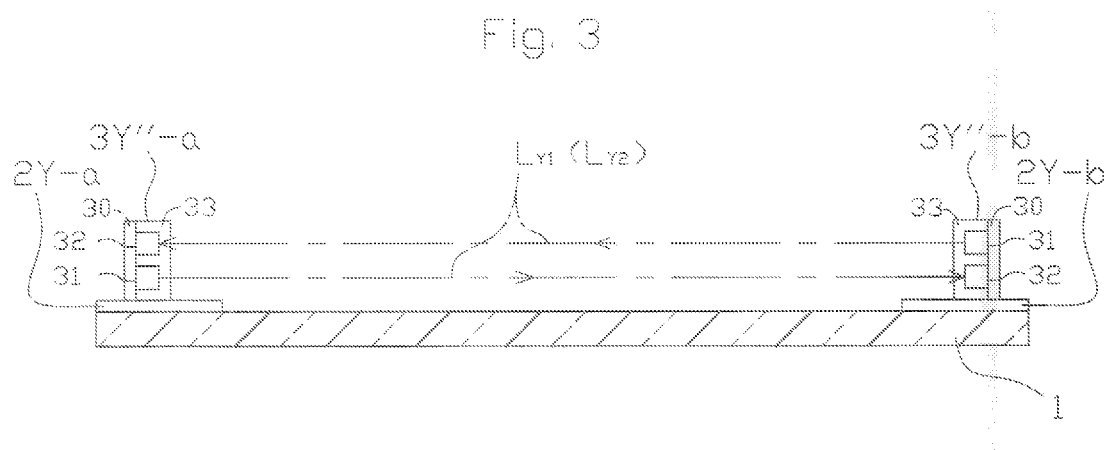

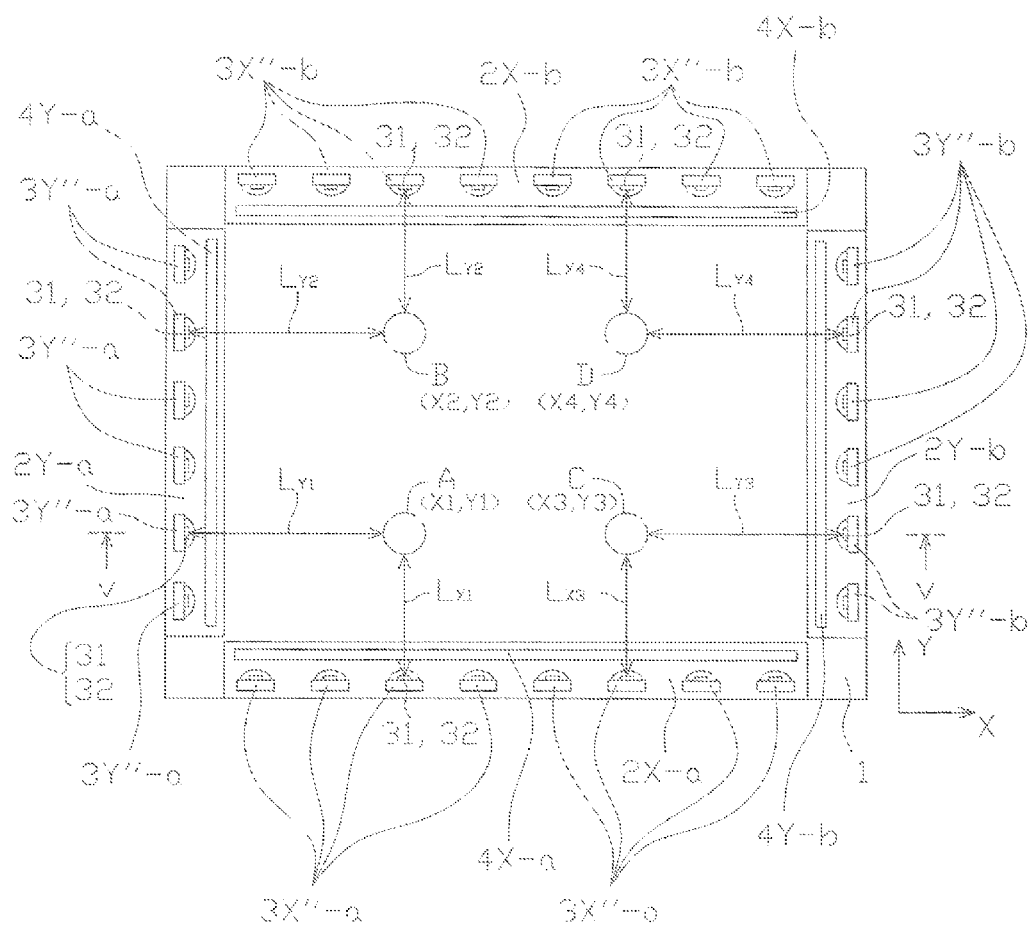

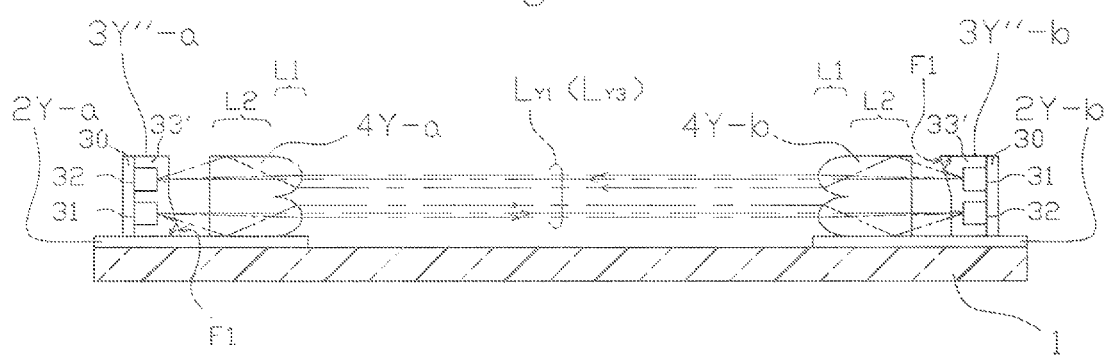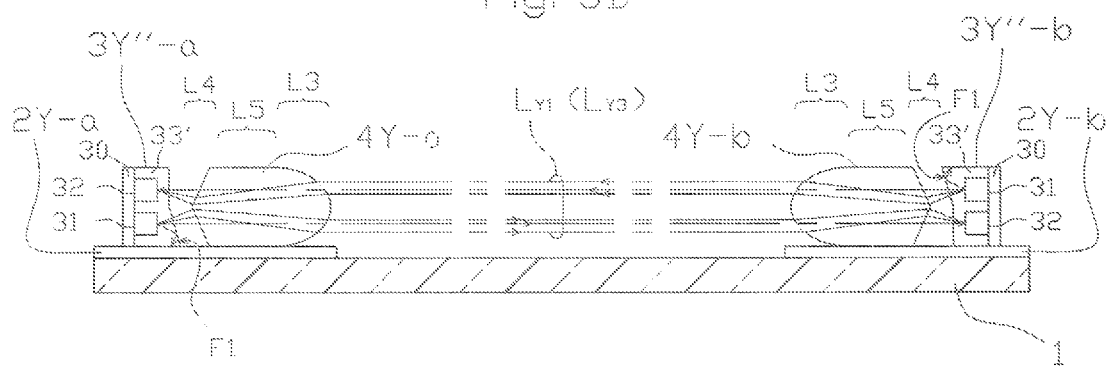

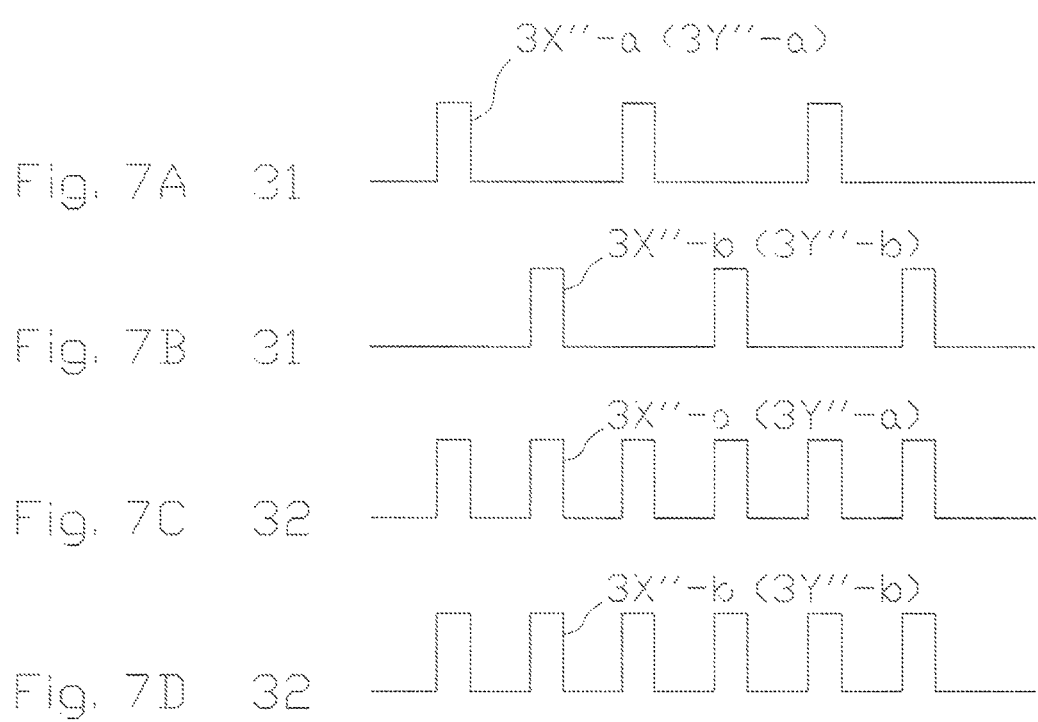

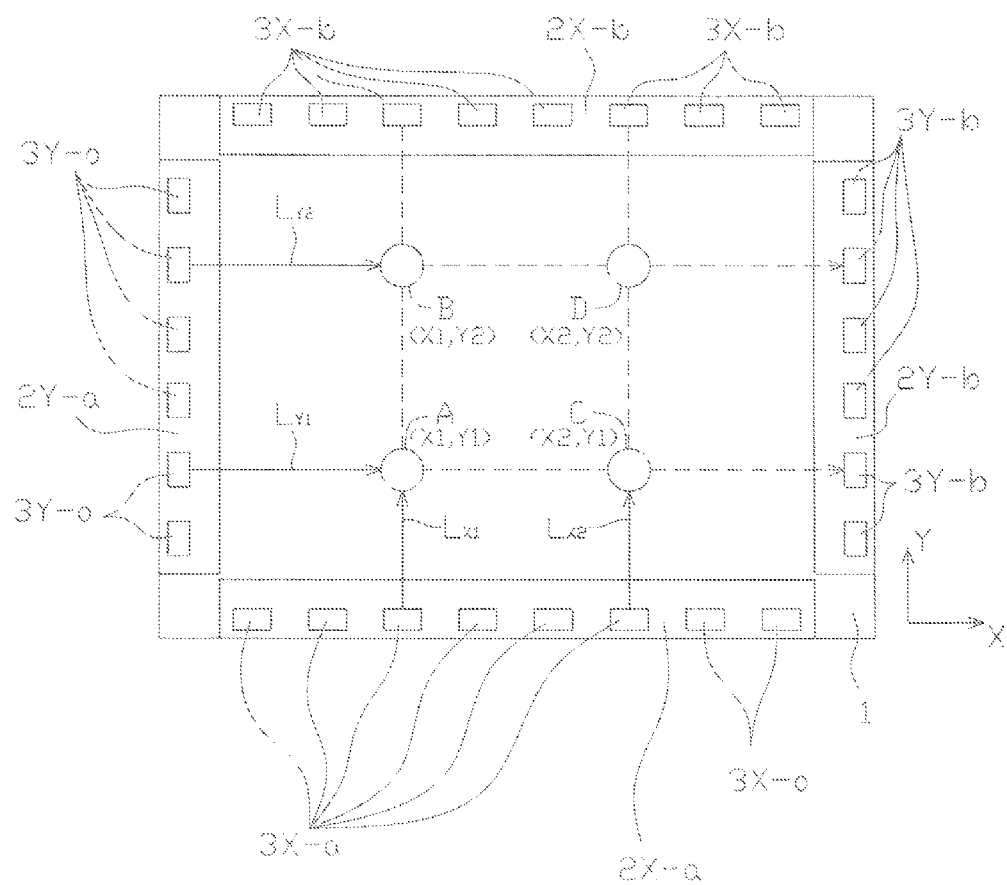

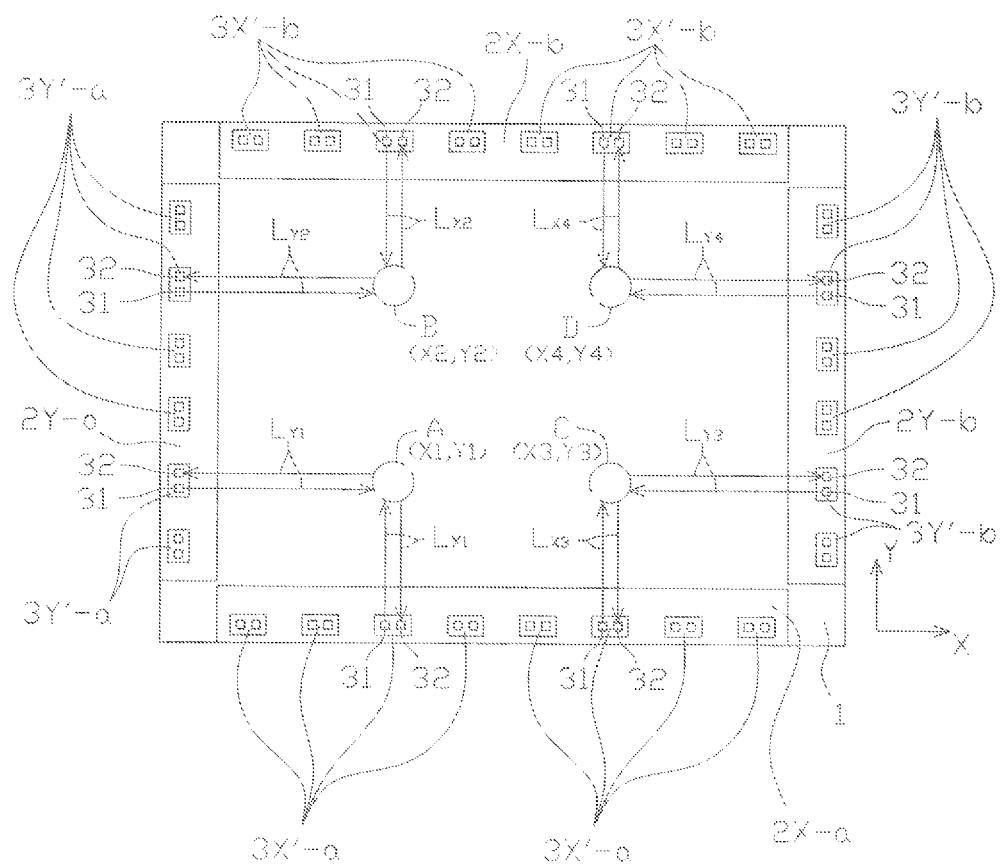

OPTICAL TOUCH PANEL INCLUDING VERTICALLY-ARRANGED LIGHT EMITTING ELEMENT AND LIGHT RECEIVING ELEMENT

This application claims the priority benefit under 35 U.S.C. §119 to Japanese Patent Application No. JP2012-109349 filed on May 11, 2012, which disclosure is hereby incorporated in its entirety by reference.

BACKGROUND

Field

The presently disclosed subject matter relates to an optical touch panel.

Description of the Related Art

In FIG. 8, which illustrates a first prior art optical touch panel (see: FIGS. 1(a), 1(b), 1(c) and 1(d) of EP2088499 A1, FIG. 2 of US2012/0200537A1), a glass substrate 1 for defining a display surface also serves as an upper glass substrate of a liquid crystal display (LCD) device, for example. Also, provided on the glass substrate 1 are two substrates 2X-a and 2X-b along a Y-direction at opposite sides to each other. Further, provided on the glass substrate 1 are two substrates 2Y-a and 2Y-b along an X-direction at opposite sides to each other.

In addition, X-direction light emitting elements such as light emitting diode (LED) elements 3X-a are equidistantly arranged on the substrate 2X-a, and X-direction light receiving elements such as phototransistor elements 3X-b are equidistantly arranged on the substrate 2X-b. The LED elements 3X-a oppose respective ones of the phototransistor elements 3X-b.

Similarly, Y-direction light emitting elements such as LED elements 3Y-a are equidistantly arranged on the substrate 2Y-a, and Y-direction light receiving elements such as phototransistor elements 3Y-b are equidistantly arranged on the substrate 2Y-b. The LED elements 3Y-a oppose respective ones of the phototransistor elements 3Y-b.

Light $L_{X1}$ emitted from one of the LED elements 3X-a passes over the display surface to reach one of the phototransistor elements 3X-b. In this case, when an object such as a finger A is present on the display surface to intercept the light $L_{X1}$, the light $L_{X1}$ does not reach the one of the phototransistor elements 3X-b. Thus, it can be determined whether or not the finger A is present on a coordinate X1 of the light $L_{X1}$ by whether or not the one of the phototransistor elements 3X-b detects the light $L_{X1}$.

Similarly, Light $L_{y1}$ emitted from one of the LED elements 3Y-a passes over the display surface to reach one of the phototransistor elements 3Y-b. In this case, when the finger A is present on the display surface to intercept the light $L_{y1}$, the light $L_{y1}$ does not reach the one of the phototransistor elements 3Y-b. Thus, it can be determined whether or not the finger a is present on a coordinate Y1 of the light $L_{Y1}$ by whether or not the one of the phototransistor elements 3Y-b detects the light $L_{Y1}$.

Thus, it is possible to determine whether or not the finger A is located at a position (X1, Y1) by whether neither of the lights $L_{Y1}$ and $L_{y1}$ are detected.

In the optical touch panel as illustrated in FIG. 8, however, even if other objects such as fingers B, C and D, whose positions are (X1, Y2), (X2, Y1) and (X2, Y2), respectively, are present simultaneously with the finger A, the fingers B, C and D cannot be detected. That is, since propagating directions of lights $L_{X1}$ and $L_{X2}$ are perpendicular to those of lights $L_{Y1}$ and $L_{Y2}$, the fingers B and C are shadowed by the finger A, and the finger D is shadowed by the fingers B and C. Thus, it is impossible to carry out a multiple touch operation using two or more fingers simultaneously.

In FIG. 9, which illustrates a second prior art optical touch panel, the LED elements 3X-a, the phototransistor elements 3X-b, the LED elements 3Y-a and the phototransistor elements 3Y-b of FIG. 8 are replaced by light emitting and receiving packages 3X'-a, light emitting and receiving packages 3X'-b, light emitting and receiving packages 3Y'-a and light emitting and receiving packages 3Y'-b, respectively. Each of the light emitting and receiving packages 3X'-a, 3X'-b, 3Y'-a, and 3Y'-b has the same configuration formed by a light emitting element such as an LED element 31 and a light receiving element such as a phototransistor 32 which are laterally and closely arranged. Thus, each of the fingers A, B, C and D can be individually detected by a reflective photo-intercepting technology.

For example, light $L_{X1}$ emitted from the LED element 31 of one of the light emitting and receiving packages 3X'-a is reflected by the finger A to reach the phototransistor element 32 thereof, and also, light $L_{Y1}$ emitted from the LED element 31 of one of the light emitting and receiving packages 3Y'-a is reflected by the finger A to reach the phototransistor element 32 thereof. Thus, it can be determined whether or not the finger A is located on a position (X1, Y1) by whether or not the reflected lights $L_{X1}$ and $L_{Y1}$ are both present simultaneously.

In addition, light $L_{X2}$ emitted from the LED element 31 of one of the light emitting and receiving packages 3X'-b is reflected by the finger B to reach the phototransistor element 32 thereof, and also, light $L_{Y1}$, emitted from the LED element 31 of one of the light emitting and receiving packages 3Y'-a is reflected by the finger B to reach the phototransistor element 32 thereof. Thus, it can be determined whether or not the finger B is located on a position (X2, Y2) by whether or not the reflected lights $L_{X2}$ and $L_{Y2}$ are both present simultaneously.

Further, light $L_{X3}$ emitted from the LED element 31 of one of the light emitting and receiving packages 3X'-a is reflected by the finger C to reach the phototransistor element 32 thereof, and also, light $L_{Y3}$ emitted from the LED element 31 of one of the light emitting and receiving packages 3Y'-b is reflected by the finger C to reach the phototransistor element 32 thereof. Thus, it can be determined whether or not the finger C is located on a position (X3, Y3) by whether or not the reflected lights $L_{X3}$ and $L_{Y3}$ are both present simultaneously.

Still further, light $L_{X4}$ emitted from the LED element 31 of one of the light emitting and receiving packages 3X'-b is reflected by the finger D to reach the phototransistor element 32 thereof, and also, light $L_{Y4}$ emitted from the LED element 31 of one of the light emitting and receiving packages 3Y'-b is reflected by the finger D to reach the phototransistor element 32 thereof. Thus, it can be determined whether or not the finger D is located on a position (X4, Y4 by whether or not the reflected lights $L_{X4}$ and $L_{Y4}$ are both present simultaneously.

Thus, even if X1=X2, the finger B is not shadowed by the finger A. Also, even if Y3=Y1, the finger C is not shadowed by the finger A. Further, even if X4=X3 and Y4=Y2, the finger D is not shadowed by the fingers B and C.

In the optical touch panel as illustrated in FIG. 9, however, in each of the light emitting and receiving packages 3X'-a, 3X'-b, 3Y'-a and 3Y'-b, when the light distributing characteristics of the LED element 31 and the light distributing characteristics of the phototransistor element 32 are deviated, the noise of the phototransistor element 32 would be increased. For example, when the optical axis of the LED element 31 of one of the light emitting and receiving packages is shifted horizontally in the right or left direction, so that the light distributing characteristics of this LED element 31 are deviated as shown in FIG. 10, light emitted from the LED element 31 and reflected by a finger would be received by the phototransistor elements of its neighboring light emitting and receiving packages to increase the noise thereof.

SUMMARY

The presently disclosed subject matter seeks to solve one or more of the above-described problems.

According to the presently disclosed subject matter, in an optical touch panel including a first group of light emitting and receiving packages and a second group of light emitting and receiving packages provided on a display surface at opposite sides to each other, each of the light emitting and receiving packages is formed by one light emitting element and one light receiving element vertically arranged above the display surface. The light emitting element of each light emitting and receiving package of the first group opposes the light receiving element of one light emitting and receiving package of the second group, and the light emitting element of each light emitting and receiving package of the second group opposes the light receiving element of one light emitting and receiving package of the first group. Thus, if the light distributing characteristics of the light emitting element and the light distributing characteristics of the light receiving element are shifted to the right or left side, the noise of the light receiving element would not be increased.

Also, first and second light guide lenses are provided to oppose light emitting and receiving faces of one group of the first and second groups of light emitting and receiving packages. In this case, each of the first and second light guide lenses includes at least one light emitting and receiving face which is two-convex shaped viewed from a side thereof. Or, each of the first and second light guide lenses includes one light emitting and receiving face which is one-convex shaped viewed from a side thereof and another light emitting and receiving face which is V-shaped viewed from the side. Thus, the first and second light guide lenses serve as condenser lenses.

Further, each of the light emitting and receiving packages includes a substrate for mounting the light emitting element and the light receiving element, and a resin layer for sealing the light emitting element and the light receiving element. In this case, the resin layer has a face portion sloped with respect to a face of the light emitting element. Or, a reflective layer is inserted into the resin layer to partition the resin layer for the light emitting element and the light receiving element. Thus, return light from the light emitting element to the light receiving element is suppressed.

Still further, the light emitting elements of the first group of light emitting and receiving packages and the light emitting elements of the second group of light emitting and receiving packages are time-divisionally operated, and the light receiving elements of the first group of light emitting and receiving packages and the light receiving elements of the second group of light emitting and receiving packages are operated in synchronization with operations of the light emitting elements of both of the first and second light emitting and receiving packages.

According to the presently disclosed subject matter, even when the light distributing characteristics of the light emitting element and the light distributing characteristics of the light receiving element are shifted horizontally in the right or left direction, the noise of the light receiving element can be suppressed.

BRIEF DESCRIPTION OF THE DRAWINGS

The above and other advantages and features of the presently disclosed subject matter will he more apparent from the following description of certain embodiments, as compared with the prior art, taken in conjunction with the accompanying drawings, wherein:

FIG. 1 is a plan view illustrating a first embodiment of the optical touch panel according to the presently disclosed subject matter;

FIG. 3 is a cross-sectional view taken along the line III-III in FIG. 1;

FIG. 4 is a view illustrating a second embodiment of the optical touch panel according to the presently disclosed subject matter;

FIGS. 5A and 5B are cross-sectional views of the optical touch panel of FIG. 4 taken along the line V-V in FIG. 4;

FIGS. 7A, 7B, 7C and 7D are timing diagrams for explaining the operation of the optical touch panels of FIGS. 1 and 4;

FIG. 8 is a plan view illustrating a first prior art optical touch panel;

FIG. 9 is a plan view illustrating a second prior art optical touch panel.

DETAILED DESCRIPTION OF EXEMPLARY EMBODIMENTS

In FIG. 1, which illustrates a first embodiment of the optical touch panel according to the presently disclosed subject matter, the light emitting and receiving packages 3X'-a, 3X'-b, 3Y'-a and 3Y'-b of FIG. 9 are replaced by light emitting and receiving packages 3X"-a, 3X"-b, 3Y"-a and 3Y"-b, respectively. In each of the light emitting and receiving packages 3X"-a, 3X"-b, 3Y"-a and 3Y"-b, the LED element 31 and the phototransistor element 32 are vertically and closely arranged. Therefore, even if the optical axis of the LED element 31 of one of the light emitting and receiving packages is shifted in the right or left direction, so that the light distributing characteristics of this LED element 31 are deviated, the noise of phototransistor elements of its neighboring light emitting and receiving packages is not increased.

Figure 2A:
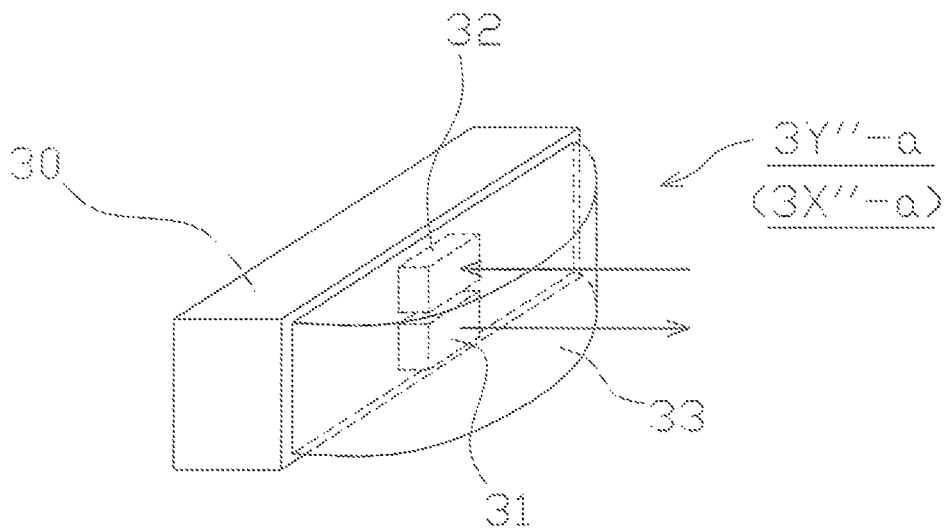
FIGS. 2A and 2B are perspective views of the light emitting and receiving packages of FIG. 1.

In FIG. 2A, which illustrates one of the light emitting and receiving packages 3Y"-a (3X"-a), the LED element 31 and the phototransistor element 32 are mounted on a substrate 30 and are sealed by a resin layer 33. In this case, the LED element 31 is located at a lower side of the phototransistor element 32.

Figure 2B:
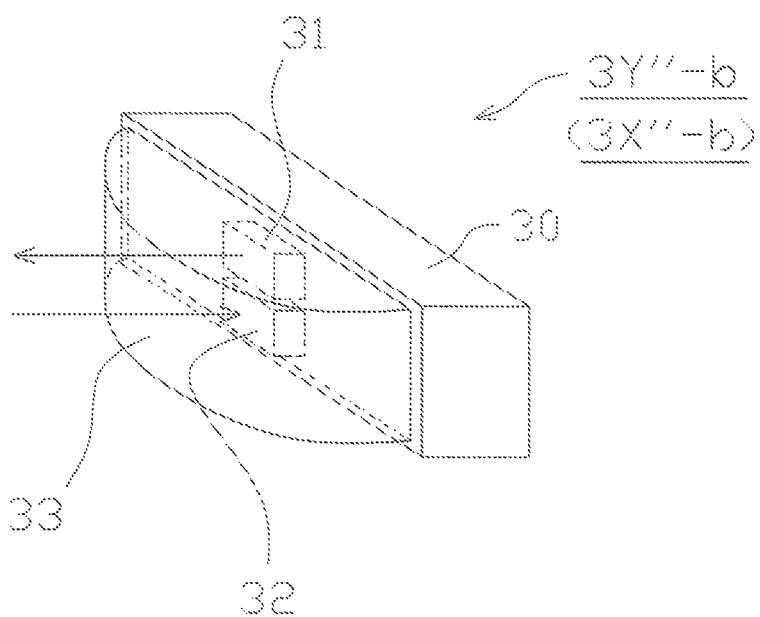

Similarly, in FIG. 2B, which illustrates one of the light emitting and receiving packages 3Y"-b (3X"-b), the LED element 31 and the phototransistor element 32 are also mounted on a substrate 30 and are sealed by a resin layer 33. In this case, the LED element 31 is located at an upper side of the phototransistor element 32.

As illustrated in FIG. 3, which is a cross-sectional view taken along the line III-III in FIG. 1, the LED element 31 of one of the light emitting and receiving packages 3Y"-a opposes the phototransistor element 32 of one of the light emitting and receiving packages 3Y"-b, and also, the LED element 31 of the one of the light emitting and receiving packages 3Y"-b opposes the phototransistor element 32 of the one of the light emitting and receiving packages 3Y"-a.

Figure 10:
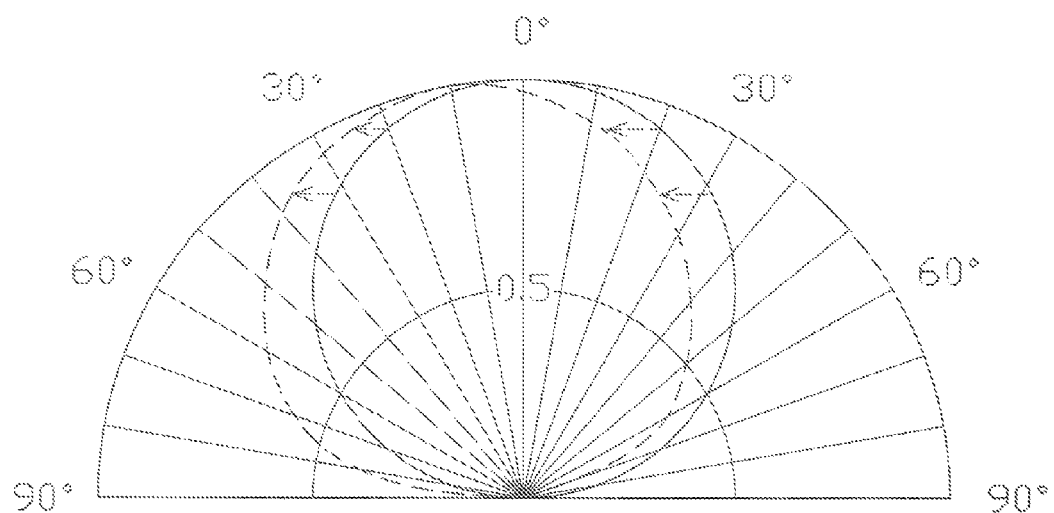
FIG. 10 is a diagram illustrating light distributing characteristics of the LED element of FIG. 9.

The optical touch panel of FIG. 1 operates in the same way as the optical touch panel of FIG. 9. In this case, even when the optical axis of the LED element 31 of one of the light emitting and receiving packages is shifted horizontally in the right or left direction, so that the light distributing characteristics of this LED element 31 are deviated as shown in FIG. 10, light emitted from the LED element 31 and reflected by a finger would not be received by the phototransistor elements of its neighboring light emitting and receiving packages. However, when the optical axis of the LED element 31 of one of the light emitting and receiving packages is shifted vertically in the up or down direction, so that the light distributing characteristics of this LED element 31 are deviated, light emitted from the LED element 31 and reflected by a finger would be received by the phototransistor element of this one of the light emitting and receiving packages to increase the noise thereof.

In FIG. 4, which illustrates a second embodiment of the optical touch panel according to the presently disclosed subject matter, one light guide lens 4X-a is provided for the light emitting and receiving packages 3X"-a to oppose light emitting and receiving faces of thereof, one light guide lens 4X-b is provided for the light emitting and receiving packages 3X"-b to oppose light emitting and receiving faces of thereof, one light guide lens 4Y-a is provided for the light emitting and receiving packages 3Y"-a to oppose light emitting and receiving faces of thereof, and one light guide lens 4Y-b is provided for the light emitting and receiving packages 3Y"-b to oppose light emitting and receiving faces of thereof.

FIGS. 5A and 5B are cross-sectional views of the optical touch panel of FIG. 4 taken along the line V-V in FIG. 4.

As illustrated in FIG. 5A, which illustrates a first example of the light guide lenses 4Y-a and 4Y-b of FIG. 4, at least one light emitting and receiving face of the light guide lenses 4Y-a and 4Y-b is two-convex shaped or R-shaped viewed from their sides to form a condenser lens L1, while the other portion L2 except for the condenser lens L1 serves as a light guide.

Also, in FIG. 5A, a face portion of the resin layer 33 opposing the LED element 31 is sloped with respect to a face F1 of the LED element 31 to suppress return light to its phototransistor element 32, thereby reducing the noise thereof.

On the other hand, as illustrated in FIG. 5B, which illustrates a second example of the light guide lenses 4Y-a and 4Y-b of FIG. 4, one light emitting and receiving face of the light guide lenses 4Y-a and 4Y-b is one-convex shaped or R-shaped viewed from their sides to form a condenser lens L1, while the other light emitting and receiving face of the light guide lenses 4Y-a and 4Y-b is V-shaped viewed from their sides to form a condenser lens L4. The other portion L5 except for the condenser lenses L3 and L4 serves as a light guide.

Also, in FIG. 5B, a face portion of the resin layer 33 opposing the LED element 31 is sloped with respect to a face F1 of the LED element 31 to suppress return light to its phototransistor element 32, thereby reducing the noise thereof.

Figure 6A:
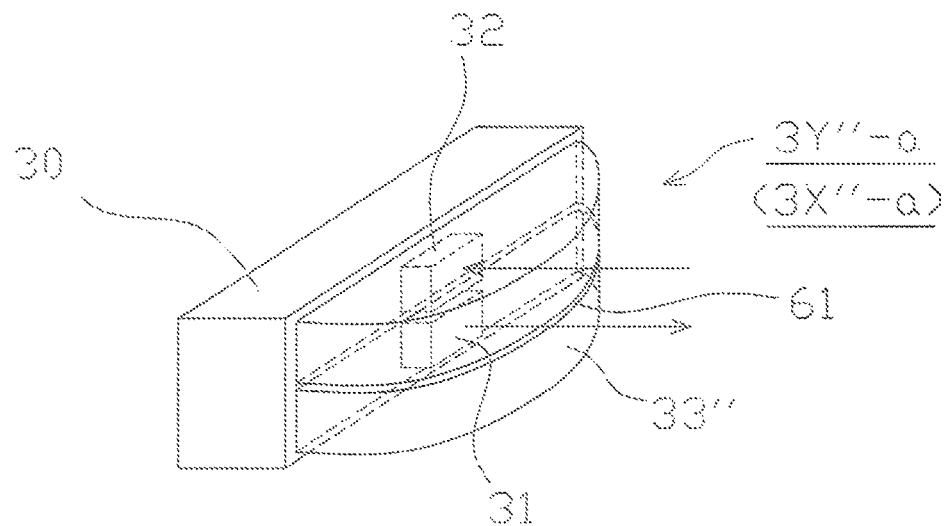
FIGS. 6A and 6B are perspective views illustrating modifications of the light emitting and receiving packages of FIGS. 5A and 5B.
Figure 6B:
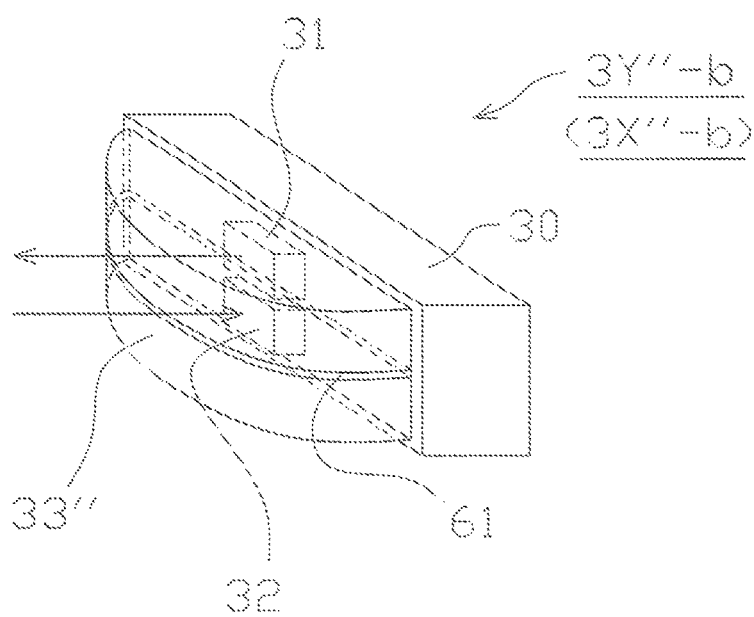

In FIGS. 6A and 6B, which are perspective views illustrating modifications of the light emitting and receiving packages of FIGS. 5A and 5B, the resin layer 33' of FIGS. 5A and 5B with the sloped face portion is replaced by a resin layer 33" into which a reflective layer 61 made of metal or the like is inserted, to thereby partition the resin layer 33" for the LED element 31 and the phototransistor element 32. In this case, the reflective layer 61 suppresses return light from the LED element 31 to its phototransistor element 32, thereby reducing the noise thereof.

An operation of the optical touch panels of FIGS. 1 and 4 is explained next with reference to FIGS. 7A, 7B, 7C and 7D.

As shown in FIGS. 7A and 7B, the LED element 31 of the light emitting and receiving packages 3X"-a (3Y"-a) and the LED elements 31 of the light emitting and receiving packages 3X"-b (3Y"-b) are time-divisionally operated, so that the LED elements 31 of the light emitting and receiving packages 3X"-a (3Y"-a) are not operated simultaneously with the LED elements 31 of the light emitting and receiving packages 3X"-b (3Y"-b). On the other hand, as shown in FIGS. 7C and 7D, the phototransistor element 32 of the light emitting and receiving packages 3X"-a (3Y"-a) and the phototransistor element 32 of the light emitting and receiving packages 3X"-b (3Y"-b) are operated in synchronization with the operations of the LED elements 31 of both of the light emitting and receiving packages 3X"-a and 3X"-b (3Y"-a and 3Y"-b), to receive transmissive light from the LED elements 31 and reflected light from objects such as fingers.

Thus, the interference between the LED elements 31 of the light emitting and receiving packages 3X"-a (3Y"-a) and the LED elements 31 of the light emitting and receiving packages 3X"-b (3Y"-b) can be avoided.

In the above-described embodiments, note that only the X-direction light emitting and receiving packages 3X"-a and 3X"-b (and the light guide lenses 4X-a and 4X-b) can be provided without the Y-direction light emitting and receiving packages 3Y"-a and 3Y"-b (and the light guide lenses 4Y-a and 4Y-b).

Also, in the above-described embodiments, the X-direction and Y-direction need not always be orthogonal to each other.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. An optical touch panel comprising:
   first packages and second packages provided on a display surface at opposite sides to each other; and
   first and second light guide lenses each opposing light emitting and receiving faces of said first and second packages, respectively,
   each of said first and second packages comprising one light emitting element and one light receiving element vertically arranged above said display surface,
   the light emitting element of each of said first packages opposing the light receiving element of one of said second packages, the light emitting element of each of said second packages opposing the light receiving element of one of said first packages, wherein each of said first and second light guide lenses includes at least one light emitting and receiving face which is two-convex shaped viewed from a side thereof to form a condenser lens while another portion of said each of said first and second light guide lenses except for said condenser lens serves as a light guide, and wherein each of said first and second packages comprises:
a substrate for mounting said light emitting element and said light receiving element; and
a resin layer for sealing said light emitting element and said light receiving element, wherein said resin layer has a sloped-face portion for said light emitting element and a flat-face portion for said light receiving element, a thickness of said sloped-faced portion being larger at its outer end than at its inner end, so that light from said light emitting element and reflected by said sloped-faced portion is prevented from being incident to said light receiving element.

2. The optical touch panel as set forth in claim 1, further comprising a reflective layer inserted into said resin layer to partition said resin layer for said light emitting element and said light receiving element.

3. The optical touch panel as set forth in claim 1, wherein the light emitting elements of said first packages and the light emitting elements of said second packages are time-divisionally operated, and
wherein the light receiving elements of said first packages and the light receiving elements of said second packages are operated in synchronization with operations of the light emitting elements of said first and second packages.

4. An optical touch panel comprising:
first packages and second packages along a first direction provided on a display surface at opposite sides to each other;
third packages and fourth packages along a second direction different from said first direction provided on said display surface at opposite sides to each other; and
first, second, third and fourth light guide lenses each opposing light emitting and receiving faces of said first, second, third and fourth packages, respectively,
each of said first, second, third and fourth packages comprising one light emitting element and one light receiving element vertically arranged above said display surface,
the light emitting element of each of said first packages opposing the light receiving element of one of said second packages,
the light emitting element of each of said second packages opposing the light receiving element of one of said first packages,
the light emitting element of each of said third packages opposing the light receiving element of one of said fourth packages, and
the light emitting element of each of said fourth packages opposing the light receiving element of one of said third packages,
wherein each of said first, second, third and fourth light guide lenses includes at least one light emitting and receiving face which is two-convex shaped viewed from a side thereof to form a condenser lens while another portion of said each of said first, second, third and fourth guide lenses except for said condenser lens serves as a light guide, and
wherein each of said first, second, third and fourth packages comprises:
a substrate for mounting said light emitting element and said light receiving element; and
a resin layer for sealing said light emitting element and said light receiving element, wherein said resin layer has a sloped-face portion for said light emitting element and a flat-face portion for said light receiving element, a thickness of said sloped-faced portion being larger at its outer end than at its inner end, so that light from said light emitting element and reflected by said sloped-faced portion is prevented from being incident to said light receiving element.

5. The optical touch panel as set forth in claim 4, further comprising a reflective layer inserted into said resin layer to partition said resin layer for said light emitting element and said light receiving element.

6. The optical touch panel as set forth in claim 4, wherein the light emitting elements of said first packages and the light emitting elements of said second packages are time-divisionally operated,
wherein the light receiving elements of said first packages and the light receiving elements of said second packages are operated in synchronization with operations of the light emitting elements of said first and second packages,
wherein the light emitting elements of said third packages and the light emitting elements of said fourth packages are time-divisionally operated, and
wherein the light receiving elements of said third packages and the light receiving elements of said fourth packages are operated in synchronization with operations of the light emitting elements of said third and fourth packages.

* * * * *